United States Patent
Oetjen et al.

(10) Patent No.: US 6,744,247 B2
(45) Date of Patent: Jun. 1, 2004

(54) METHOD AND MEASURING DEVICE FOR MEASURING THE SPECTRA IN ADJACENT CHANNELS

(75) Inventors: Martin Oetjen, Gröbenzell (DE); Rolf Lorenzen, Unterhaching (DE); Falko Fiechtner, Memmingen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/220,884
(22) PCT Filed: Jul. 5, 2001
(86) PCT No.: PCT/EP01/07723
§ 371 (c)(1), (2), (4) Date: Dec. 17, 2002
(87) PCT Pub. No.: WO02/11295
PCT Pub. Date: Feb. 7, 2002

(65) Prior Publication Data
US 2003/0151399 A1 Aug. 14, 2003

(30) Foreign Application Priority Data
Jul. 28, 2000 (DE) .......................... 100 36 877
Sep. 6, 2000 (DE) .......................... 100 43 894

(51) Int. Cl.[7] .............................................. G01R 23/00
(52) U.S. Cl. ................................................. 324/76.19
(58) Field of Search ..................... 324/76.19, 76.39, 324/76.31, 76.28; 375/316; 455/23; 332/117; 329/315

(56) References Cited

U.S. PATENT DOCUMENTS

| 5,706,202 A | 1/1998 | Itahara et al. |
| 6,344,735 B1 * | 2/2002 | Yoshino et al. .......... 324/76.39 |

FOREIGN PATENT DOCUMENTS

| DE | 196 47 090 | 5/1997 |
| EP | 0 081 172 | 11/1982 |
| EP | 0 186 936 | 7/1986 |
| JP | 11194145 | 7/1999 |
| WO | 96/22540 | 7/1996 |

* cited by examiner

*Primary Examiner*—N. Le
*Assistant Examiner*—Amy He
(74) *Attorney, Agent, or Firm*—Christensen O'Connor Johnson Kindness PLLC

(57) ABSTRACT

A measuring device (1), for measuring the spectrum of a measured signal in several neighboring channels ($15_{-9}$–$15_9$) of a working channel (14), includes a selective filter (9) which damps the working channel (14) more strongly than the neighboring channels ($15_{-9}$–$15_9$). Furthermore an analogue/digital converter (5) is provided which detects the filtered measured signal from all the channels to be measured ($15_{-9}$–$15_9$, 14) in a parallel and broadband manner and converts the above to a digital signal. An equaliser (11) in series with the analogue/digital converter (5), equalises the digital signal with a frequency response which is the reciprocal of the frequency response of the selective filter (9).

12 Claims, 1 Drawing Sheet

METHOD AND MEASURING DEVICE FOR MEASURING THE SPECTRA IN ADJACENT CHANNELS

This is a United States national stage application of International application No. PCT/EP01/07723, filed Jul. 5, 2001, the benefit of the filing date of which is hereby claimed under 35 U.S.C. § 120, which in turn claims the benefit of German application No. 100 36 877.8, filed Jul. 28, 2000, and German application No. 100 43 894.6 filed Sep. 6, 2000, the benefit of the filing dates of which is hereby claimed under 35 U.S.C. § 119.

BACKGROUND OF THE INVENTION

The invention concerns a method for measuring the spectrum of a measurement signal in several neighbouring channels adjacent to a working channel and a corresponding measurement device.

The standard ETSI Specs GSM 11.21 defines the maximum signal level of incidental emissions in the neighbouring channels adjacent to a working channel. To check whether mobile phone stations or base stations meet this standard, the measuring method according to the invention and the measuring device according to the invention are used. The measuring method and the device according to the invention are however also suitable in principle for measuring incidental emissions in neighbouring channels of signals, in particular mobile phone signals, to other standards in particular the EDGE standard or the UMTS standard.

The specification to ETSI Specs 11.21 requires a check of both the spectrum due to modulation and the spectrum due to switching. The GSM signal is divided as is known into several frames with a frame duration of approximately 4.7 ms. The said specification requires, for measurement of the spectrum due to modulation, the measurement of 21 channels (the working channel and neighbouring channels above and below the working channel) for at least 200 frames which are then averaged. If the measurements for each channel are performed separately, in total 21×200 measurements must be performed with a duration of at least 4.7 ms, so that the theoretical minimum measurement period is around 20 seconds. With automatic measurement of mobile stations or base stations for example at the end of production, this measurement period is relatively long, in particular as also further measurements of other specifications must be performed. This measurement duration can therefore hinder the production process.

In addition measurement of the spectrum due to switching must be performed. The said specification here requires measurement of 9 channels (the working channel and neighbouring channels above and below the working channel) for at least 20 frames.

SUMMARY OF THE INVENTION

The invention is therefore based on the task of producing a method for measuring the spectrum of a measurement signal in several neighbouring channels adjacent to a working channel and a corresponding measurement device in which the total measurement duration is substantially reduced.

The task is solved in relation to the method by the features of claim 1 and in relation to the measurement device by the features of claim 7. The sub-claims concern advantageous refinements of the invention.

The invention is firstly based on the knowledge that the measurement time can be significantly shortened if the individual measurement channels are measured not in series but in parallel. For this it is necessary to detect the broadband measurement signal and not restrict it before the analog/digital converter to the measurement bandwidth of the channel concerned (e.g. 30 kHz for the neighbouring channel and 300 kHz for the working channel) but supply the broadband measurement signal to the analog/digital converter. It has however been found that parallel detection of the measurement signal is not possible without a further measure according to the invention, as the signal strength in the neighbouring channels, in particular in the neighbouring channels relatively remote from the working channel, is approximately 65 dB lower than in the working channel. As the analog/digital converter only has a limited resolution and also due to the higher signal strength at the working channel must not be over-modulated, the problem arises as how these high dynamic requirements can be fulfilled. According to the invention therefore it is proposed to arrange a selective filter before the analog/digital converter which attenuates the measurement signal in the working channel substantially more than in the neighbouring channels. As a result an over-modulation of the analog/digital converter in the working channel is avoided and the measurement signal reaches the analog/digital converter in the neighbouring channels with a higher signal level. As a result the signal can be quantized relatively well even in the neighbouring channels. After the analog/digital converter is connected an equaliser, the frequency response of which is reciprocal to the frequency response of the selective filter. The influence of the selective filter on the measurement signal is thus compensated before analysis.

Advantageously the selective filter attenuates the measurement signal in the neighbouring channels increasingly weakly as the distance from the working signal increases, so that in each case the signal of the nearest neighbouring channels is attenuated even more than the signal in the more remote neighbouring channels. As a result the modulation of the analog/digital converter can be further improved.

In measuring the spectrum of the working channel it is advantageous to switch off the selective filter. As the signal of the working signal is in any case the dominant signal, in measurement of the working channel the selective filter offers no advantages but has the disadvantage that because of the lack of constancy of the frequency response within the 300 kHz wide measurement bandwidth in the working channel, i.e. at the summit of the filter curve, the measurement signal is falsified.

Connected before the analog/digital converter is preferably a variable amplifier or a variable attenuator, the amplification factor or attenuation factor of which is set so that the modulation range of the analog/digital converter is utilised at least almost completely without over-modulation.

The bandpass filter which reduces the bandwidth to the measurement bandwidth, i.e. for example to 30 kHz for the neighbouring channels and 300 kHz for the working channel, is preferably before the analog/digital converter. The equaliser and the bandpass filter are preferably housed in a digital signal processor which can also contain further signal processing elements.

An embodiment example of the invention is described in more detail below with reference to the drawing. The drawing shows:

DETAILED DESCRIPTION OF THE INVENTION

Figure 1:
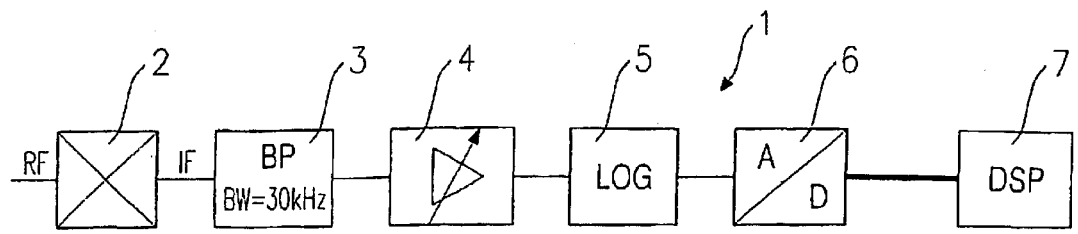
FIG. 1 a measurement device according to the state of the art.

FIG. 1 shows an example of a measurement device 1 according to the state of the art.

The high frequency measurement signal RF is lowered in a mixing and intermediate frequency stage 2 to the intermediate frequency IF and then supplied to a bandpass filter 3. The bandpass filter 3 limits the measurement bandwidth BW to 30 kHz in the adjacent channels to be measured in succession. At the same time the bandpass filter suppresses the signal level of the working channel. This filtered signal is supplied to a variable amplifier 4, the amplification factor of which can be set. After the variable amplifier 4 is an element 5 with a non-linear for example logarithmic curve in order to utilise the modulation range of the subsequent analog/digital converter 6 as evenly as possible, so that the quantization stages are small for signals of low level and large for signals of high level. The digital signal at the output of the analog/digital converter 6 is supplied to a digital signal processor 7.

As already described in this arrangement it is disadvantageous that the spectra must be measured in series in all 21 channels due to modulation measurement or in all 9 channels due to switching measurement, which leads to an undesirably long total measurement time. As however only one measurement channel is measured in each case, the amplification factor of the variable amplifier 4 can be adapted so that the analog/digital converter 6 in each case is modulated at least almost completely. The high signal level in the working channel is suppressed in measurement of the neighbouring channels via the bandpass filter 3 so that no over-modulation of the analog/digital converter 6 occurs. With this arrangement there is no dynamic problem in the sense that simultaneously signals with high and low level must be measured with good resolution of the signal with low level. Because of this benefit previously serial measurement has been retained.

Figure 2:
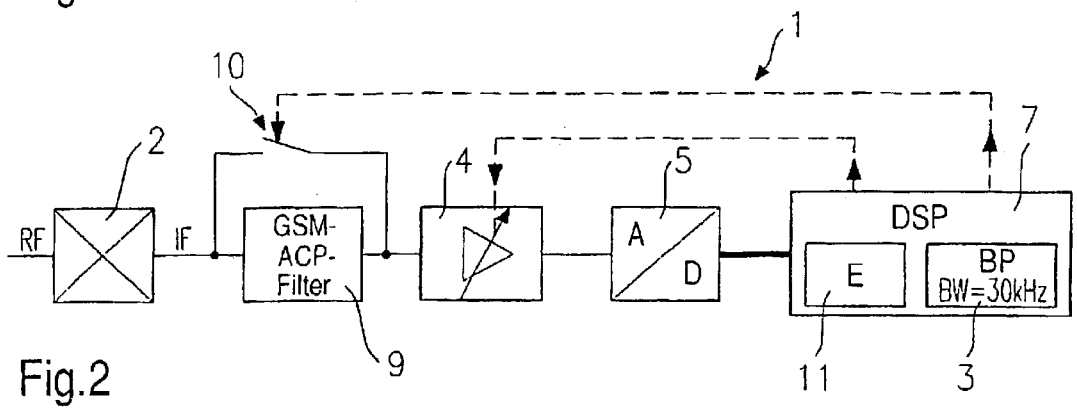
FIG. 2 an embodiment example of a measurement device according to the invention, and FIG. 3 an example of a spectrum of the measurement signal and the frequency response of the selective filter.

FIG. 2 shows an embodiment example of the measurement device according to the invention where elements corresponding to FIG. 1 have corresponding reference figures.

By deviation from the measurement device 1 shown in FIG. 1 according to the state of the art, in the embodiment example of the invention shown in FIG. 2 the intermediate frequency IF of the measurement signal is supplied to a selective filter 9 which is marked in FIG. 2 as the GSM-ACP filter, where ACP stands for adjacent channel power. The selective filter 9 in the preferred embodiment example shown can be bridged by a switch 10 which for example can be actuated by the digital signal processor 7. Connected after the selective filter 9 is the amplifier 4 with adjustable amplification factor, the amplification factor of which can also be changed by the digital signal processor 7. After the amplifier 4 comes the analog/digital converter 5 which converts the measurement signal into a digital signal which is supplied to the digital signal processor 7. In the digital signal processor 7 is an equaliser 11. The frequency response of the equaliser 11 is designed so that it is reciprocal to the frequency response of the selective filter 9 so that the effect of the selective filter 9 and the equaliser 11 are mutually compensated. Furthermore the bandpass filter 3 which limits the bandwidth to the channel to be measured is also part of the digital signal processor. The equaliser 11 and the bandpass filter 3 can with the usual means of digital filtration be implemented in both hardware and software. As well as the bandpass filter shown in FIG. 2 with a bandwidth BW of 30 kHz, a second bandpass filter 3 can be arranged with a bandwidth of 300 kHz to measure the working signal.

Figure 3:
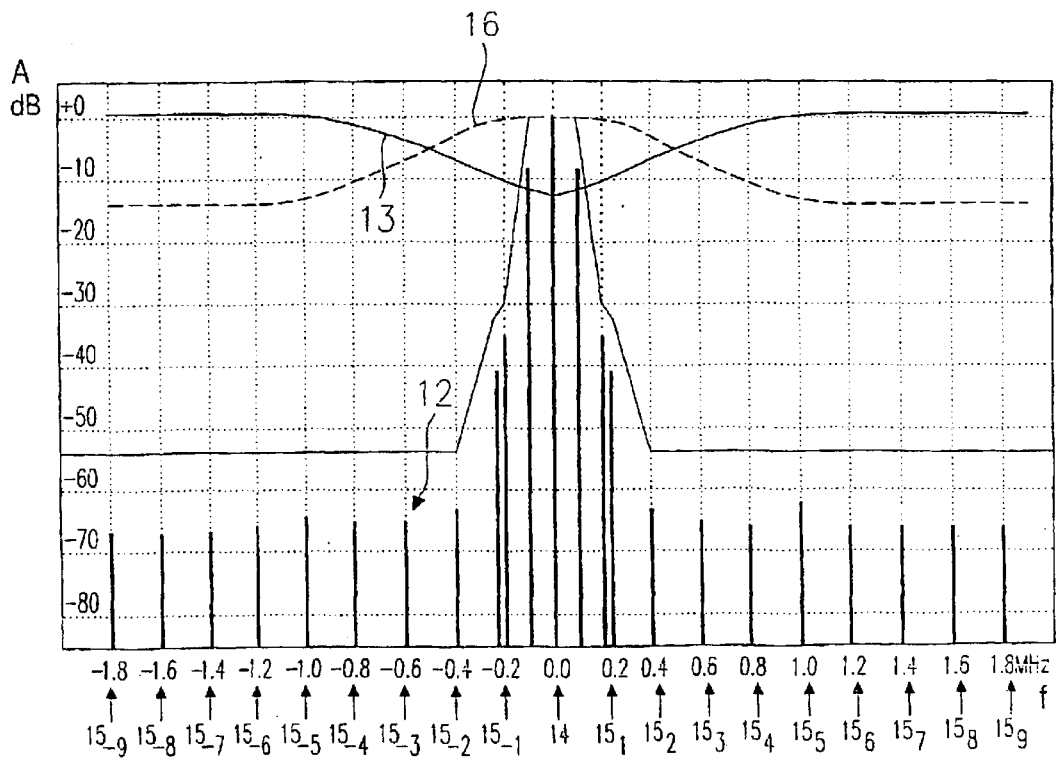

FIG. 3 shows the measurement points prescribed according to the standard ETSI Specs GSM 11.21 in the signal spectrum. The channel interval is 200 kHz. Whereas in the measurement of the spectrum due to modulation both the adjacent channels $15_{-9}$–$15_9$ and the working channel 14 are measured with a bandwidth of 30 kHz, in the measurement of the spectrum due to switching the measurement in the adjacent channels $15_{-4}$–$15_4$ takes place with a bandwidth of 30 kHz, in the working channel 14 however with a bandwidth of 300 kHz. The signal strength expected at the individual measurement points is shown with the bar 12 in the spectrum. The very large dynamic range is clear. The signal level to be expected in the remote neighbouring channels $15_{-9}$–$15_{-2}$, $15_2$–$15_9$ is more than 65 dB smaller than the signal level in the working channel 14.

If the neighbouring channels $15_{-9}$–$15_9$ were measured in parallel without the selective filter 9 according to the invention, the problem would arise that the signal level of the working channel 14 which is more than 65 dB higher would limit the modulation of the analog/digital converter 5. For if the amplification factor of the amplifier 4 were set so that the signal level in the working channel 14 did not quite over-modulate the analog/digital converter 5, the signal in the remote neighbouring channels $15_{-9}$–$15_{-2}$, $15_2$–$15_9$ would be more than 65 dB weaker and thus be not or scarcely resolvable by the analog/digital converter 5. This problem does not occur in the measurement process according to FIG. 1 in principle because of the bandpass filter 3 which is connected not after but before, as the bandpass filter 3 suppresses adequately the higher signal level of the working channel 14.

The selective filter 9 according to the invention however weakens the measurement signal at least in the area of the working channel 14, preferably also in the neighbouring areas, so much that adequate modulation of the analog/digital converter 5 is possible even for remote neighbouring channels $15_{-9}$, $15_9$. Here the amplification factor of the variable amplifier 4 can be increased so far that over-modulation of the analog/digital converter 5 is avoided, the resolution of the analog/digital converter 5 is however largely utilised. In the embodiment example shown in FIG. 3 the selective filter 9 attenuates the signal in the working channel by approximately 15 dB. Thus the signal level in the remote neighbouring channel 15 can be raised by approximately 15 dB. The frequency response of the selective filter 9 is shown in FIG. 3 for example by curve 13.

The selective filter 9 according to the invention indeed leads to a distortion of the measurement signal. This distortion can however be compensated by the equaliser 11 provided preferably in the digital signal processor 7, as the equaliser 11 has a frequency response reciprocal to the frequency response of the selective filter 9. The frequency response of the equaliser 11 has at the midrange frequency for example attenuation 0, and either side of the midrange falls to around 15 dB. The frequency response of the equaliser is shown in FIG. 3 in a dotted line as curve 16.

As already described in the measurement due to switching, measurement of the working channel 14 with a bandwidth of 300 kHz is required. As can be seen from FIG. 3 the frequency response of the selective filter 9 from −150 kHz to +150 kHz is not sufficiently constant. In the measurement of the working channel 14 however the selective filter 9 is not required as here the measurement signal is the signal with the highest signal level and thus other signals with higher signal level need not be suppressed. In this case it is advantageous to bridge the selective filter 9 with switch 10 and at the same time in the digital signal processor 7 disconnect the function of the equaliser 11 to avoid falsification of the measurement by the selective filter 9.

The invention is not restricted to the embodiment example described and can be used in a multiplicity of other concrete circuit designs. Furthermore the process according to the invention is not restricted to measurement processes according to the GSM standard but can be applied in the same way to other signals in particular other mobile phone signals.

What is claimed is:

1. A method for measuring the spectrum of a measurement signal in several neighbouring channels ($15_{-9}$–$15_9$) adjacent to a working channel (14) with the following process steps:

parallel broadband detection of a measurement signal over all measurement channels to be measured ($15_{-9}$–$15_9$, 14), filtering of the broadband detected measurement signal with a selective filter (9) which attenuates the working channel (14) more than the adjacent channels ($15_{-9}$–$15_9$), conversion of the filtered analog measurement signal into a digital signal, and equalisation of the digital signal with an equaliser (11), the frequency response of which is reciprocal to the frequency response of the selective filter (9).

2. A method according to claim 1, characterized in that the selective filter (9) attenuates the measurement signal in the neighbouring channels ($15_{-9}$–$15_9$) more weakly as the distance from the working channel (14) increases.

3. A method according to claim 1 or 2, characterized in that at the same time the spectrum in the working channel (14) is measured.

4. A method according to claim 3, characterized in that the digital signal in the working channel (14) is subjected to a broader band bandpass filtration than in the neighbouring channels ($15_{-9}$–$15_9$).

5. A method according to claim 3 or 4, characterized in that in the measurement of the spectrum of the working channel (14) the selective filter (9) is disconnected.

6. A method according to any of claims 1 to 5, characterized in that the measurement signal is a mobile phone signal, in particular a signal according to the GSM, EDGE or UTMS standard.

7. A measurement device (1) for measuring the spectrum of a measurement signal in several neighbouring channels ($15_{-9}$–$15_9$) adjacent to a working channel (14) with a selective filter (9) which attenuates the working channel (14) more than the neighbouring channels ($15_{-9}$–$15_9$), an analog/digital converter (5) which detects the filtered measurement signal in parallel broadband over all channels to be measured ($15_{-9}$–$15_9$) and converts this into a digital signal, and an equaliser (11) which equalises the digital signal with a frequency response reciprocal to the frequency response of the selective filter (9).

8. A measurement device according to claim 7, characterized in that the selective filter (9) attenuates the measurement signal of the adjacent channels ($15_{-9}$–$15_9$) increasingly more weakly as the distance from the working channel (14) increases.

9. A measurement device according to claim 7 or 8, characterized in that connected before the analog/digital converter (5) is a variable amplifier (4) or a variable attenuator, the amplification factor or attenuation factor of which is set so that the modulation range of the analog/digital converter (5) is fully utilised at least almost completely without over-modulation.

10. A measurement device according to any of claims 7 to 9, characterized in that a digital bandpass filter (3) is connected after the analog/digital converter (5).

11. A measurement device according to claim 10, characterized in that as well as the spectra in the neighbouring channels ($15_{-9}$–$15_9$), the spectrum in the working channel (14) is also measured and the bandpass filter (3) for the working channel (14) has a greater bandwidth than for the adjacent channels ($15_{-9}$–$15_9$).

12. A measurement device according to claim 10 or 11, characterized in that the equaliser (11) and the bandpass filter (3) are part of a digital signal processor (7).

* * * * *